United States Patent
Orita et al.

(10) Patent No.: US 10,121,931 B2
(45) Date of Patent: Nov. 6, 2018

(54) FILM FORMATION DEVICE

(75) Inventors: Hiroyuki Orita, Tokyo (JP); Takahiro Shirahata, Tokyo (JP); Akio Yoshida, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 1090 days.

(21) Appl. No.: 13/990,641

(22) PCT Filed: Mar. 15, 2011

(86) PCT No.: PCT/JP2011/055986
§ 371 (c)(1),
(2), (4) Date: May 30, 2013

(87) PCT Pub. No.: WO2012/124047
PCT Pub. Date: Sep. 20, 2012

(65) Prior Publication Data
US 2013/0247820 A1   Sep. 26, 2013

(51) Int. Cl.
*B05B 7/04* (2006.01)
*C23C 16/448* (2006.01)
(Continued)

(52) U.S. Cl.
CPC ............ *H01L 31/1876* (2013.01); *B05B 1/04* (2013.01); *B05B 7/0012* (2013.01);
(Continued)

(58) Field of Classification Search
CPC ....... B05B 7/04–7/0491; B05B 7/0012; B05B 1/04; C23C 16/4486; C23C 16/45514; C23C 16/45595
See application file for complete search history.

(56) References Cited

U.S. PATENT DOCUMENTS 5,545,436 A    8/1996 Saito et al.
6,349,668 B1 *  2/2002 Sun et al. ................. 118/723 R
(Continued)

FOREIGN PATENT DOCUMENTS

DE         197 28 622 A1    1/1999
DE    10 2008 000 843 A1   10/2009
(Continued)

OTHER PUBLICATIONS

Taiwanese Search Report dated Mar. 14, 2014 in Patent Application No. 100124897 (with English language translation).
(Continued)

*Primary Examiner* — Dah-Wei D. Yuan
*Assistant Examiner* — Stephen A Kitt
(74) *Attorney, Agent, or Firm* — Oblon, McClelland, Maier & Neustadt, L.L.P.

(57) ABSTRACT

The present invention includes a mist generator that generates a mist of a raw material of a film to be formed, and a mist jet nozzle that jets the mist generated by the mist generator to a substrate on which a film is to be formed. The mist jet nozzle includes: a main body having a hollow portion; a mist supply port that supplies the mist; a spout that jets the mist to the outside; a carrier gas supply port that supplies a carrier gas; and a shower plate having a plurality of holes formed therein. By the arrangement of the shower plate, the hollow portion is divided into a first space connected to the carrier gas supply port and a second space connected to the spout. The mist supply port is connected to the second space.

10 Claims, 15 Drawing Sheets

(51) Int. Cl.
*C23C 16/455* (2006.01)
*H01L 31/18* (2006.01)
*B05B 1/04* (2006.01)
*B05B 7/00* (2006.01)

(52) U.S. Cl.
CPC .......... *B05B 7/0416* (2013.01); *B05B 7/0458* (2013.01); *C23C 16/4486* (2013.01); *C23C 16/45514* (2013.01); *C23C 16/45595* (2013.01)

(56) References Cited

U.S. PATENT DOCUMENTS

| | | |
|---|---|---|
| 6,367,715 B1 | 4/2002 | Rieth |
| 7,410,676 B2 | 8/2008 | Kim et al. |
| 2002/0029748 A1 | 3/2002 | Kuwada et al. |
| 2003/0089608 A1 | 5/2003 | Kumekawa |
| 2003/0089799 A1 | 5/2003 | Kanno |
| 2005/0082385 A1 | 4/2005 | Kuwada et al. |
| 2008/0292810 A1* | 11/2008 | Anderson et al. ............ 427/565 |
| 2013/0039843 A1 | 2/2013 | Shirahata et al. |

FOREIGN PATENT DOCUMENTS

| | | |
|---|---|---|
| EP | 2 105 532 A2 | 9/2009 |
| EP | 2 105 532 A3 | 9/2009 |
| JP | 61 69961 | 4/1986 |
| JP | 10 308388 | 11/1998 |
| JP | 11-200052 A | 7/1999 |
| JP | 2001-54746 A | 2/2001 |
| JP | 2006-249490 A | 9/2006 |
| JP | 2007 254869 | 10/2007 |
| TW | 550119 B | 9/2003 |
| TW | I260676 B | 8/2006 |
| TW | I303084 B | 11/2008 |

OTHER PUBLICATIONS

International Search Report dated May 17, 2011 in PCT/JP11/55986 filed Mar. 15, 2011.

Search Report dated Aug. 5, 2014, in Chinese Patent Application No. 2011800651473 with partial English translation.

International Preliminary Report on Patentability and Written Opinion dated Oct. 10, 2013 in PCT/JP2011/055986 (English Translation only).

International Preliminary Report on Patentability and Written Opinion dated Sep. 26, 2013 in PCT/JP2011/055986 with English Translation.

Office Action dated Nov. 5, 2013 in German Patent Application No. 11 2011 105 041.0 (submitting English language translation).

* cited by examiner

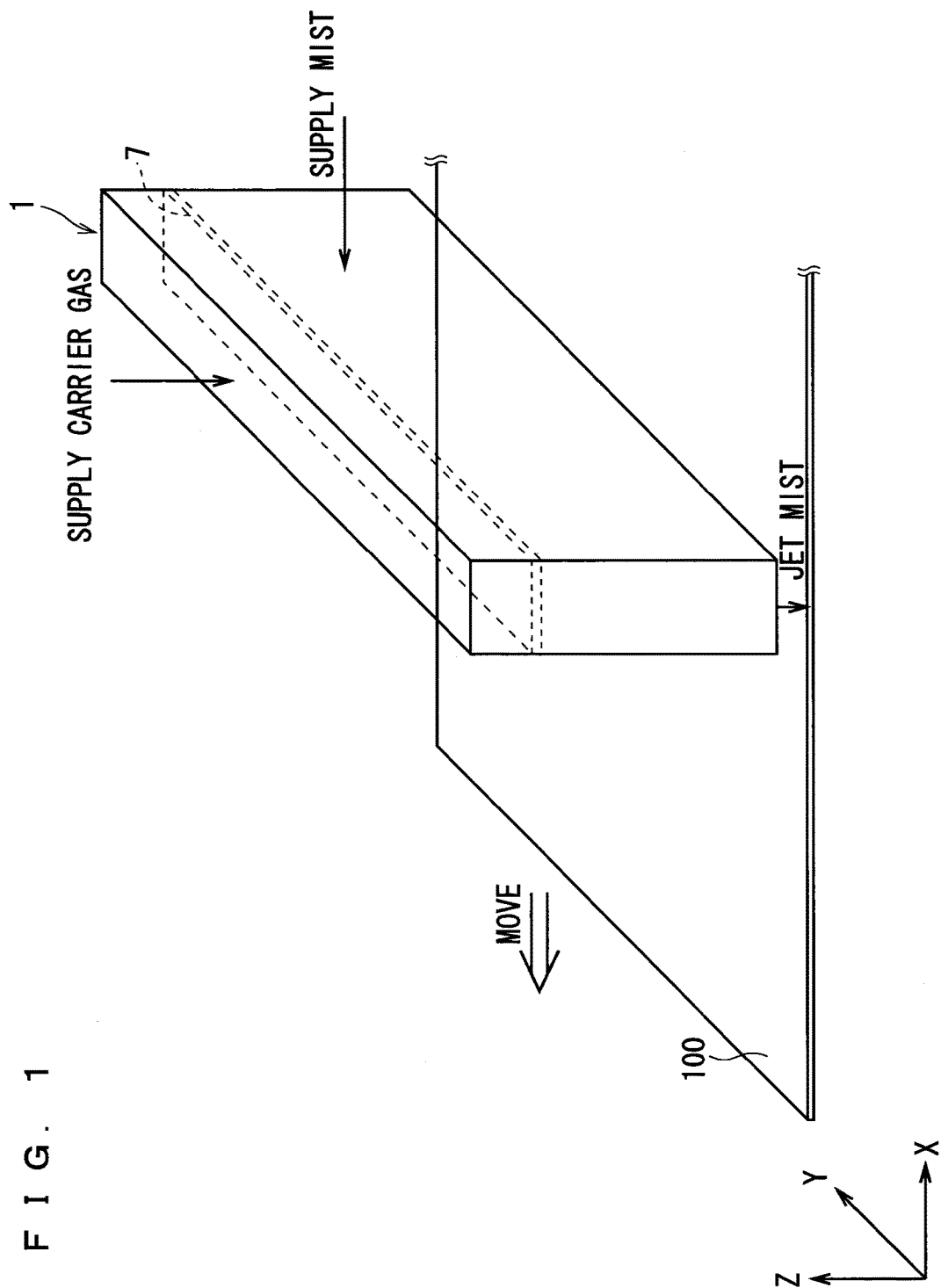
F I G. 1

F I G . 3
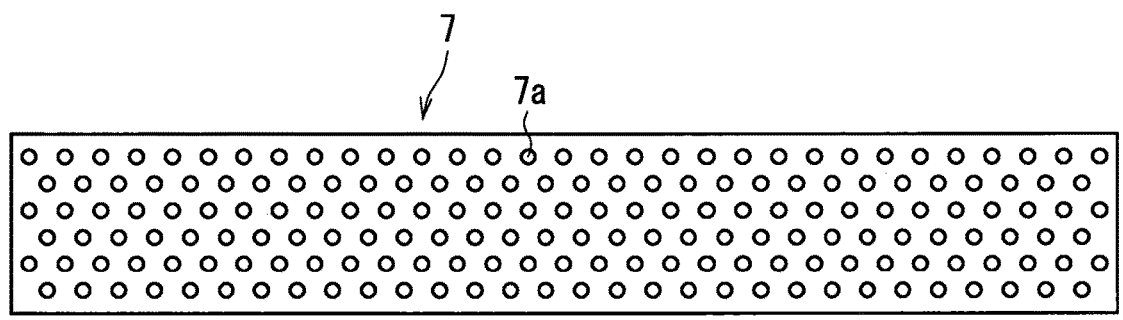

F I G. 4
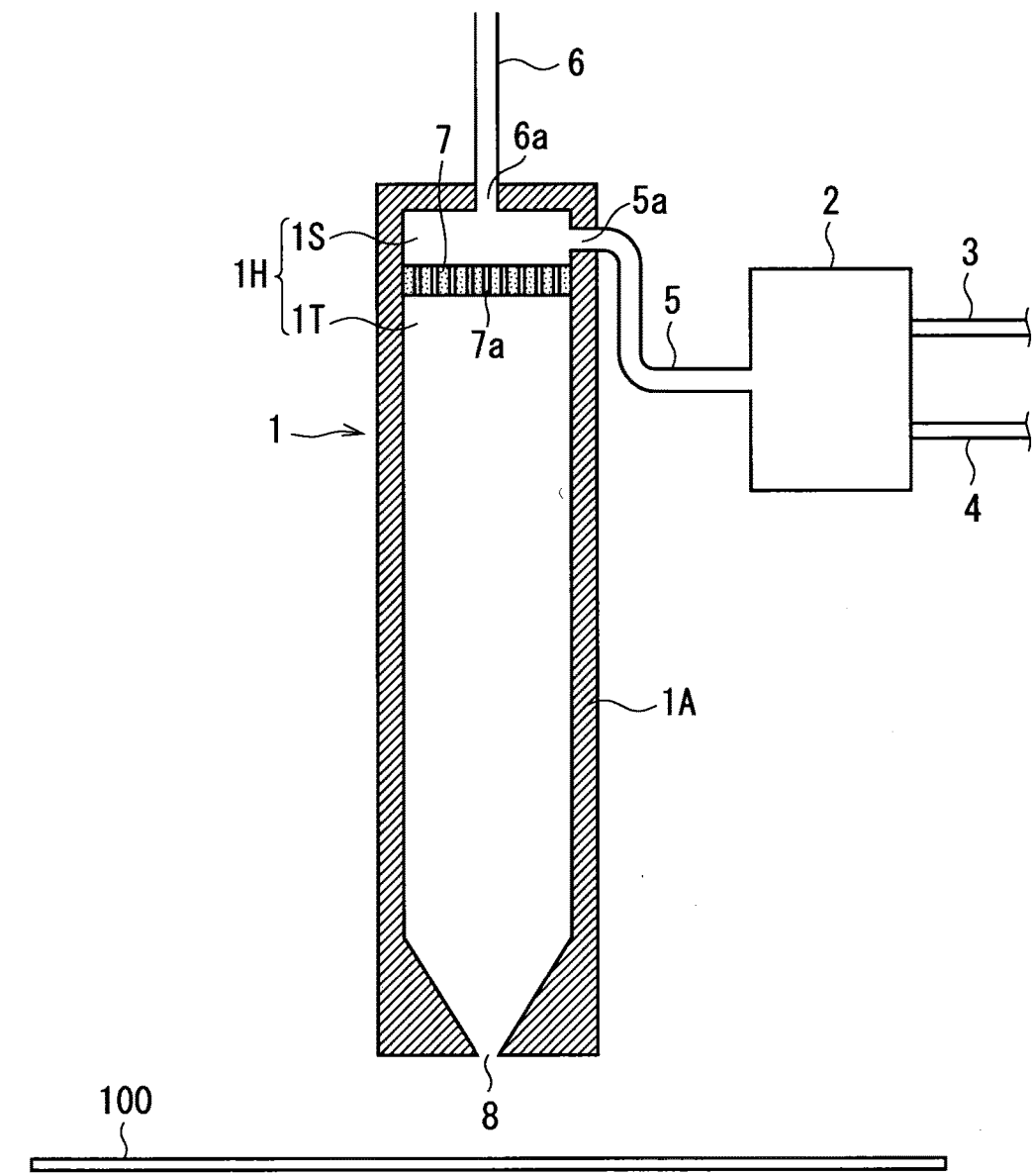

F I G . 1 2
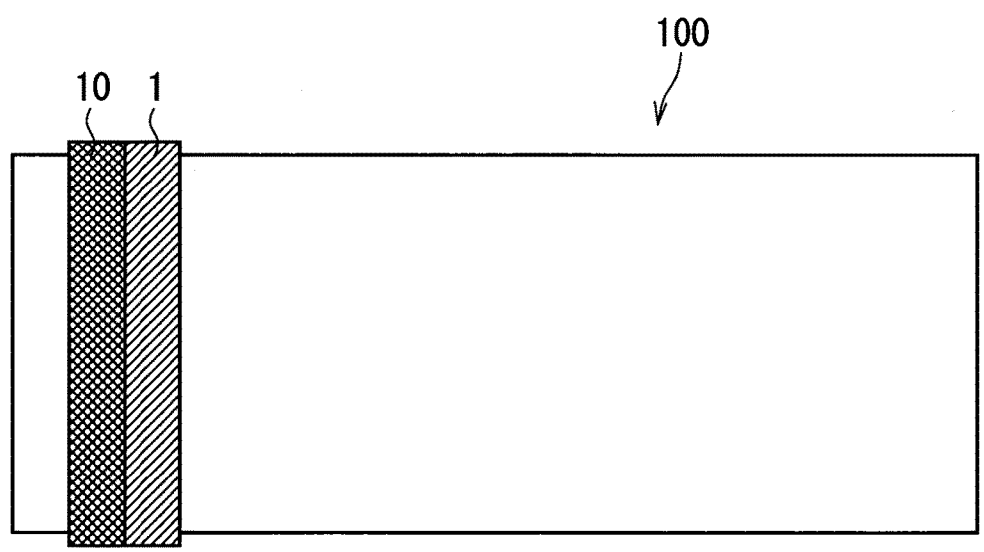
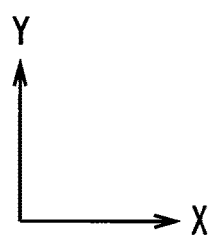

FILM FORMATION DEVICE

This application is a National Stage of PCT/JP11/55986 filed Mar. 15, 2011.

TECHNICAL FIELD

The present invention is an invention relating to a film formation device that forms a thin film, and particularly to a film formation device that is able to form a thin film on a substrate by jetting a mist to the substrate.

BACKGROUND ART

In a method for manufacturing an electronic device such as a solar cell or a light-emitting diode, the step for forming a thin film on a substrate is performed. For example, there is a conventional art in which a mist of a raw material is jetted to a substrate and thereby a thin film is formed on the substrate (see Patent Document 1).

Patent Document 1 discloses a technique in which a substrate is sprayed with a mist of a raw material jetted from a jet nozzle and thereby a thin film is formed on the substrate. The jet nozzle includes a gas reservoir having a large volume, a jet part having a flattened cross-sectional shape, and a mist supply tube. The jet nozzle is arranged such that the mist of the raw material is spouted in a direction perpendicular to a direction that is in parallel with a plane of the substrate.

PRIOR-ART DOCUMENTS

Patent Documents

Patent Document 1: Japanese Patent Application Laid-Open No. 2007-254869

SUMMARY OF THE INVENTION

Problems to be Solved by the Invention

In the technique disclosed in Patent Document 1, the mist of the raw material is supplied through a mist supply port provided in the gas reservoir, and this mist of the raw material is spouted through a spout whose cross-sectional area is smaller than that of the supply port, to thereby achieve uniformization of the mist of the raw material.

However, in the technique disclosed in Patent Document 1, it is necessary that the mist supply port has a large cross-sectional area, in order to enable the mist of the raw material to be uniformly jetted. To be specific, the opening area of the spout is set to be a predetermined size, and it is necessary to ensure that the area of the mist supply port is sufficiently larger than this opening area of the spout. Moreover, in a case where the technique disclosed in Patent Document 1 is applied to formation of a thin film having a large area, in order to enable the mist to be uniformly jetted, it is necessary that many thick pipes configured to supply the mist are provided in the gas reservoir relative to the spout having a flattened cross-sectional shape.

Therefore, the technique disclosed in Patent Document 1 involves a problem that the size of a configuration around the jet nozzle increases. That is, in the technique disclosed in Patent Document 1, there is a limitation that the total opening area of the mist supply port should be sufficiently increased in accordance with the opening area of the spout, which makes it difficult to simplify a configuration of the jet nozzle. This increase in the size of the configuration deteriorates the maintenance properties around the jet nozzle, complicates the assembling of the jet nozzle, and additionally increases manufacturing costs.

Therefore, an object of the present invention is to provide a film formation device that is able to prevent a size increase in a configuration around a mist jet nozzle while maintaining uniform spouting of a mist to a substrate on which a film is to be formed.

Means for Solving the Problems

To attain the object mentioned above, a film formation device according to the present invention includes: a mist generator that generates a mist of a raw material of a film to be formed; and a mist jet nozzle that jets the mist generated by the mist generator to a substrate on which a film is to be formed. The mist jet nozzle includes: a main body having a hollow portion; a mist supply port formed in the main body and configured to supply the mist generated by the mist generator to the inside of the hollow portion; a first spout formed in the main body and configured to jet the mist contained in the hollow portion to the outside; at least one carrier gas supply port formed in the main body and configured to supply a carrier gas to the inside of the hollow portion, the carrier gas transporting the mist to the first spout; and a shower plate arranged within the hollow portion and having a plurality of holes formed therein. The hollow portion is divided into a first space and a second space by the arrangement of the shower plate, the first space being connected to the carrier gas supply port, the second space being connected to the first spout. The mist supply port is formed in the main body so as to be connected to the second space.

Effects of the Invention

The film formation device according to the present invention includes: a mist generator that generates a mist of a raw material of a film to be formed; and a mist jet nozzle that jets the mist generated by the mist generator to a substrate on which a film is to be formed. The mist jet nozzle includes: a main body having a hollow portion; a mist supply port formed in the main body and configured to supply the mist generated by the mist generator to the inside of the hollow portion; a first spout formed in the main body and configured to jet the mist contained in the hollow portion to the outside; at least one carrier gas supply port formed in the main body and configured to supply a carrier gas to the inside of the hollow portion, the carrier gas transporting the mist to the first spout; and a shower plate arranged within the hollow portion and having a plurality of holes formed therein. The hollow portion is divided into a first space and a second space by the arrangement of the shower plate, the first space being connected to the carrier gas supply port, the second space being connected to the first spout. The mist supply port is formed in the main body so as to be connected to the second space.

Accordingly, the carrier gas having been supplied into the first space and spread therein passes through the shower plate, and thereby is uniformized. Then, the carrier gas flows into the second space. The mist having been supplied into the second space and stayed therein is regulated in its flow and uniformized by the carrier gas, and conveyed (drifted) to the first spout. This allows the uniformized mist together with the carrier gas to be spouted from the first spout toward the substrate. In this manner, by spraying a uniform mist to the substrate, a desired thin film can be uniformly formed on an upper surface of the substrate.

Moreover, as described above, the presence of the shower plate enables a uniform mist to be jetted from the first spout, without increasing the opening area and the number of mist supply ports. Accordingly, the opening area and the number of mist supply ports can be made small, which can prevent a size increase in the configuration around the mist jet nozzle. This improves the maintenance properties around the mist jet nozzle, makes the assembling of the mist jet nozzle easy, and additionally reduces the manufacturing costs.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 A perspective view illustrating an outline configuration of an external appearance of a mist jet nozzle 1 according to an embodiment 1.

FIG. 3 A plan view illustrating a configuration of a shower plate 7.

FIG. 4 A cross-sectional view illustrating a configuration of a nozzle to be compared against the mist jet nozzle 1 according to the embodiment 1.

FIG. 12 A plan view illustrating an outline configuration of a film formation device according to an embodiment 5.

EMBODIMENT FOR CARRYING OUT THE INVENTION

The present invention relates to a film formation device for use in formation of a thin film on a substrate. Particularly, a film formation device according to the present invention includes a mist jet nozzle that jets a mist of a raw material of a thin film toward a substrate, to cause the thin film to be formed on the substrate by the jetting of the mist. Here, in the present invention, a thin film is formed on a substrate not by exposing the substrate to a vaporized gas but by spraying a liquid "mist" to the substrate.

In the present specification, the liquid "mist" indicates a mist whose droplet has a particle diameter of 100 µm or less. No particular limitation has to be put on the lower limit of the particle diameter of the "mist", as long as in the liquid form. In one example, the lower limit of the particle diameter of the "mist" is about 0.1 µm.

In the following, a specific description will be given to the invention with reference to the drawings illustrating embodiments of the invention.

Embodiment 1

Figure 2:
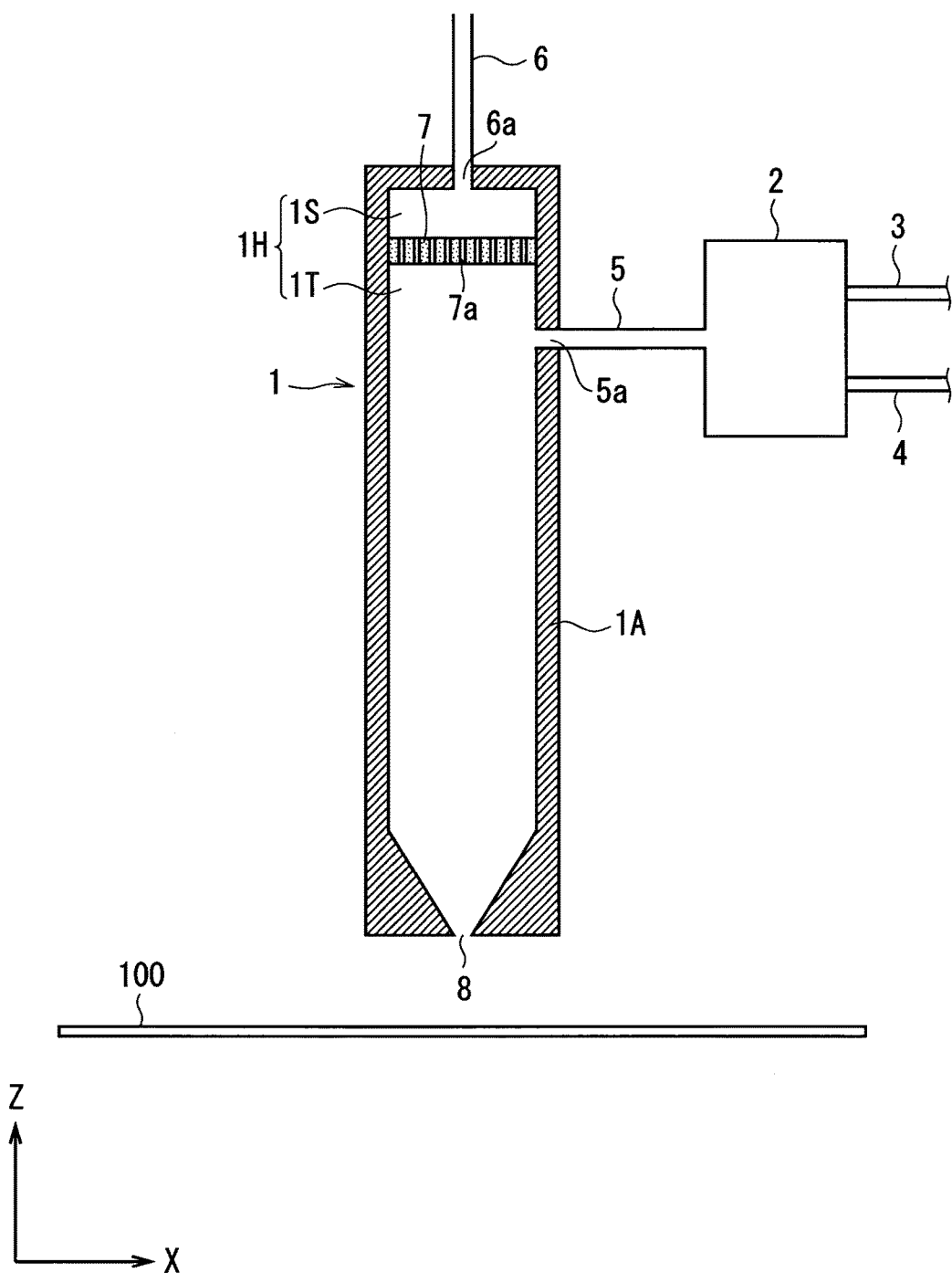
FIG. 2 A cross-sectional view illustrating a configuration of a film formation device according to the embodiment 1.

FIG. 1 is a perspective view illustrating a configuration of an external appearance of a mist jet nozzle 1 included in a film formation device according to this embodiment. In FIG. 1, coordinate axes X-Y-Z are also shown. FIG. 2 is a cross-sectional view illustrating an outline configuration of the entire film formation device. FIG. 2 is a cross-sectional view of the configuration of FIG. 1, as seen along the Y-direction.

For simplification of the drawing, a mist generator 2, various kinds of pipes 3, 4, 5, and 6, a mist supply port 5a, a carrier gas supply port 6a, and a first spout 8, which are illustrated in FIG. 2, are not shown in FIG. 1. In FIG. 2, an X-Z coordinate system is also shown.

In an exemplary configuration shown in FIG. 1, in order to form a thin film on a substrate 100 having a rectangular shape with a side length of 1 m or more, the mist jet nozzle 1 is located above the substrate 100. The mist jet nozzle 1 jets a mist, which serves as a raw material of a film, to an upper surface of the substrate 100. At this stage, while the jetting is performed, for example, the substrate 100 is moved in a horizontal direction. The jetting of the mist along with such a movement allows the mist to be jetted to the whole of the upper surface of the substrate 100. As a result, a uniform thin film can be formed throughout the whole of the upper surface of the substrate 100.

Here, the substrate 100 has been heated to a film formation temperature. During the jetting of the mist, the distance between the upper surface of the substrate 100 and an end portion of the mist jet nozzle 1 is set to be, for example, about several tens of mm or less.

As shown in FIG. 2, the film formation device includes the mist jet nozzle 1 and the mist generator 2.

As shown in FIG. 2, the mist jet nozzle 1 includes a main body 1A with a hollow portion 1H. As shown in FIGS. 1 and 2, an outline external appearance of the main body 1A has a substantially rectangular parallelepiped shape whose width in the X-direction is short (for example, about several cm), whose depth in the Y-direction is long (slightly longer than the diameter of the substrate 100 in the Y-direction, and for example, about 1 m or more), and whose height in the Z-direction is slightly large (for example, about 10 to 20 cm).

The main body 1A may be made of, for example, stainless steel, but from the viewpoint of weight reduction, aluminum is adoptable. In a case where the main body 1A is made of aluminum, it is desirable to perform a coating process in order to improve corrosion resistance of the main body 1A.

As shown in FIG. 2, the mist supply port 5a, the carrier gas supply port 6a, and the spout (that can be considered as a first spout) 8 are formed to pierce the main body 1A.

The mist supply port 5a, which is provided in a side wall of the main body 1A, serves as an entrance for a mist that is generated by the mist generator 2 and supplied into the hollow portion 1H of the main body 1A. As shown in FIG. 2, in this embodiment, the mist generated by the mist generator 2 passes through the mist pipe 5 and reaches the mist supply port 5a, and is supplied from the mist supply port 5a to the inside of the main body 1A.

The number of mist supply ports 5a may be one, or alternatively two or more mist supply ports 5a may be provided along the Y-direction in the side wall of the main body 1A. However, from the viewpoint of simplification of the configuration of the mist jet nozzle 1, a smaller number of mist supply ports 5a is preferable. Needless to say, in accordance with the number of mist supply ports 5a, corresponding mist pipes 5 each connecting each of the mist supply ports 5a to the mist generator 2 are arranged.

When the opening area of the mist supply port 5a and the opening area of the mist pipe 5 are excessively small, they may be clogged with the mist. Therefore, the opening area of the mist supply port 5a and the opening area of the mist pipe 5 are set to be sizes that can prevent such clogging.

The spout 8 serves as an exit for the mist, and jets the mist contained within the main body 1A toward the substrate 100. Accordingly, the spout 8 is formed in a surface of the main body 1A facing the upper surface (on which a thin film is to be formed) of the substrate 100 during the jetting of the mist. That is, the spout 8 is formed in a lower surface of the main body 1A. The width of the spout 8 in the X-direction is narrower than the width of the hollow portion 1H of the main body 1A in the X-direction. For example, the width of the spout 8 in the X-direction is about 1 to 2 mm. An opening of the spout 8 has a slit-like shape, and the diameter of the spout 8 in the Y-direction is approximately slightly smaller than the diameter of the main body 1A in the Y-direction. A thin portion of the main body 1A is located at both ends of the spout 8 with respect to the Y-direction.

In an exemplary configuration shown in FIG. 2, the carrier gas supply port 6a is provided in a surface of the main body 1A opposed to the spout 8 (that is, in an upper surface of the main body 1A) (the carrier gas supply port 6a may be arranged in a side surface of the main body 1A as long as the carrier gas supply port 6a is connected to a first space 1S as will be described later). The carrier gas supply port 6a serves as an entrance for a carrier gas that is supplied from the outside of the mist jet nozzle 1 into the hollow portion 1H of the main body 1A. As shown in FIG. 2, the carrier gas passes through a carrier gas pipe 6 and reaches the carrier gas supply port 6a, and is supplied from the carrier gas supply port 6a to the inside of the main body 1A.

Here, the carrier gas is a gas for transporting a mist staying in the hollow portion 1H of the main body 1A to the spout 8 and spouting the mist from the spout 8. As the carrier gas, for example, air, nitrogen, or an inert gas is adoptable.

The number of carrier gas supply ports 6a may be one, or alternatively two or more carrier gas supply ports 6a may be provided in the main body 1A. However, from the viewpoint of simplification of the configuration of the mist jet nozzle 1, a smaller number of carrier gas supply ports 6a is preferable. Needless to say, in accordance with the number of carrier gas supply ports 6a, corresponding carrier gas pipes 6 each connected to each of the carrier gas supply ports 6a are arranged.

When the opening area of the carrier gas supply port 6a and the opening area of the carrier gas pipe 6 are excessively large, the size of the configuration may increase. Accordingly, it is preferable that the opening area of the carrier gas supply port 6a and the opening area of the carrier gas pipe 6 are as small as possible such that a later-described relationship is satisfied between these opening areas and the opening area of a hole 7a that pierces a shower plate 7.

The shower plate 7 is arranged in the mist jet nozzle 1. As shown in FIGS. 1 and 2, the shower plate 7 is arranged within the hollow portion 1H of the main body 1A. As seen from FIG. 2, the shower plate 7 divides the hollow portion 1H into two spaces 1S and 1T. That is, the shower plate 7 partitions the inside of the hollow portion 1H into a first space 1S and a second space 1T.

FIG. 3 is a plan view of the shower plate 7 in an X-Y plane.

The shower plate 7 is a thin plate and may be made of, for example, stainless steel. In a configuration illustrated in FIG. 3, a plurality of holes 7a are evenly formed to pierce the shower plate 7 (unlike FIG. 3, uneven formation may also be acceptable). In an exemplary configuration shown in FIG. 3, the opening of each hole 7a has a circular shape, and the holes 7a are arranged in a staggered pattern. Each of the holes 7a is formed through the shower plate 7 in a thickness direction thereof. Through the holes 7a, the carrier gas in a "gaseous state" passes. Accordingly, the opening of each hole 7a is able to have a fine diameter. No particular limitation is put on the diameter of the opening of each hole 7a, but in one example, it is about 0.01 mm.

As shown in FIG. 2, the carrier gas supply port 6a is connected to the first space 1S, while the spout 8 and the mist supply port 5a are connected to the second space 1T. The carrier gas supplied from the carrier gas supply port 6a spreads and permeates the first space 1S because of the presence of the shower plate 7, and passes through the holes 7a to be uniformly led to the second space 1T. On the other hand, along with a stream of the carrier gas, the mist that has been supplied from the mist supply port 5a and permeated the second space 1T is led to the spout 8 and uniformly jetted from the spout 8.

In the mist generator 2 shown in FIG. 2, a raw material solution in which a raw material of the thin film to be formed is dissolved is supplied through the raw material solution pipe 4. The mist generator 2 turns the raw material solution thus supplied into a mist (atomization). Then, in accordance with the stream of the carrier gas that is transported from the carrier gas pipe 3, the mist generator 2 supplies the mist, which is the atomized raw material, into the mist jet nozzle 1 through the mist pipe 5. Here, as the carrier gas, for example, air, nitrogen, or an inert gas is adoptable.

As described above, in the film formation device according to this embodiment, the mist jet nozzle 1 is configured such that the shower plate 7 having a large number of holes 7a is arranged within the hollow portion 1H, and the mist supply port 5a is formed at the downstream side of the shower plate 7 and at the upstream side of the spout 8 with respect to the stream of the carrier gas.

Therefore, the carrier gas having been supplied into the first space 1S and spread therein passes through the shower plate 7, and thereby is uniformized. Then, the carrier gas flows into the second space 1T. The mist having been supplied into the second space 1T and stayed therein is regulated in its flow and uniformized by the carrier gas, and conveyed (drifted) to the spout 8. This allows the uniformized mist together with the carrier gas to be spouted from the spout 8 toward the substrate 100. In this manner, by spraying a uniform mist to the substrate 100 in a heated state, a desired thin film can be uniformly formed on the upper surface of the substrate 100.

Moreover, as described above, the presence of the shower plate 7 enables a uniform mist to be jetted from the spout 8, without increasing the opening area and the number of mist pipes 5 and the opening area and the number of the mist supply ports 5a as in the technique disclosed in Patent Document 1. Accordingly, the opening area and the number of mist pipes 5 and the opening area and the number of mist supply ports 5a can be made small, which can prevent a size increase in the configuration around the mist jet nozzle 1. This improves the maintenance properties around the mist jet nozzle 1, makes the assembling of the mist jet nozzle 1 easy, and additionally reduces the manufacturing costs.

As for the carrier gas as well, the presence of the shower plate 7 enables the carrier gas having spread in the first space 1S to be uniformly sent into the second space 1T, even when the opening area and the number of the carrier gas pipe 6 and the opening area and the number of the carrier gas supply port 6a are reduced.

A configuration is also conceivable in which the mist supply port 5a is connected not to the second space 1T but to the first space 1S as shown in FIG. 4. However, when the configuration shown in FIG. 4 is adopted, there is a possibility that the mist may clog the holes 7a that pierce the shower plate 7.

In this respect, as shown in FIG. 2, the mist supply port 5a is provided in the main body 1A such that the mist supply port 5a is arranged at the downstream side of the shower plate 7 with respect to the stream of the carrier gas (that is, such that the mist supply port 5a is connected to the second space 1T). This can prevent occurrence of a situation where the mist clogs the holes 7a that pierce the shower plate 7. In the configuration shown in FIG. 2, the carrier gas flows through the holes 7a that pierce the shower plate 7. However, since the carrier gas is in the "gaseous state", a situation where the carrier gas clogs the holes 7a does not occur.

Adoption of the configuration in which the opening width (the width in the X-direction) of the spout 8 is made narrower than the width (the width in the X-direction) of the hollow portion 1H as shown in FIG. 4 enables a more uniformized mist to be jetted from the spout 8.

Embodiment 2

In this embodiment, a description will be given to the relationship between the opening area of the hole 7a formed in the shower plate 7 and the opening area of the carrier gas supply port 6a.

In this embodiment, the summation of the opening areas of the plurality of holes 7a formed in the shower plate 7 is smaller than the opening area of the carrier gas supply port 6a. In a case where there are two or more carrier gas supply ports 6a, the summation of the opening areas of the holes 7a is smaller than the summation of the opening areas of the carrier gas supply ports 6a.

Adoption of such a configuration enables the carrier gas to be sent out with a uniform flow rate from the holes 7a of the shower plate 7 into the second space 1T while making the carrier gas spread in the first space 1S.

Embodiment 3

Figure 5:
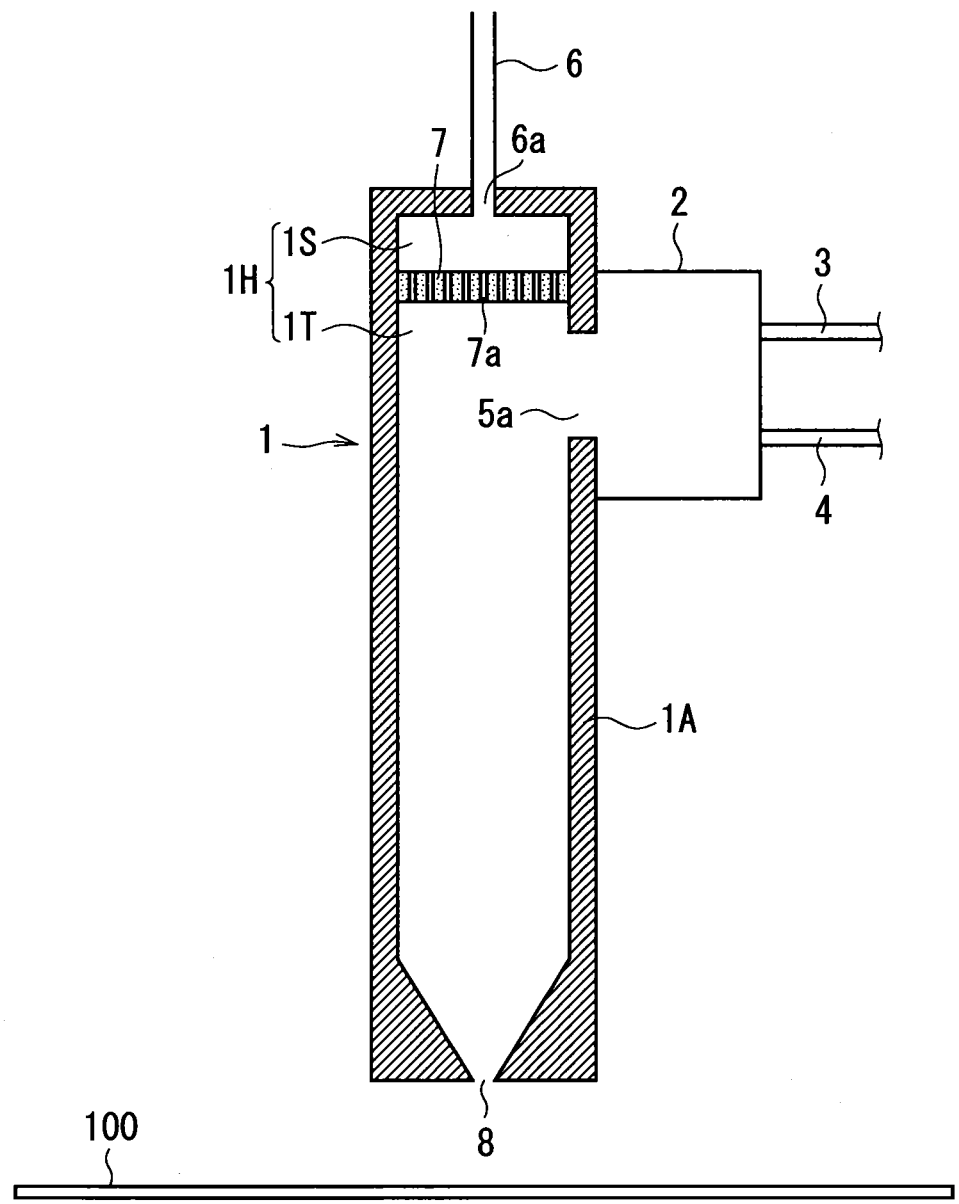
FIG. 5 A cross-sectional view illustrating a configuration of a film formation device according to an embodiment 3.

FIG. 5 shows a configuration of a film formation device according to this embodiment.

As shown in FIG. 5, in this embodiment, the mist pipe 5 is not provided, and the mist generator 2 is directly connected to the mist jet nozzle 1.

Figure 6:
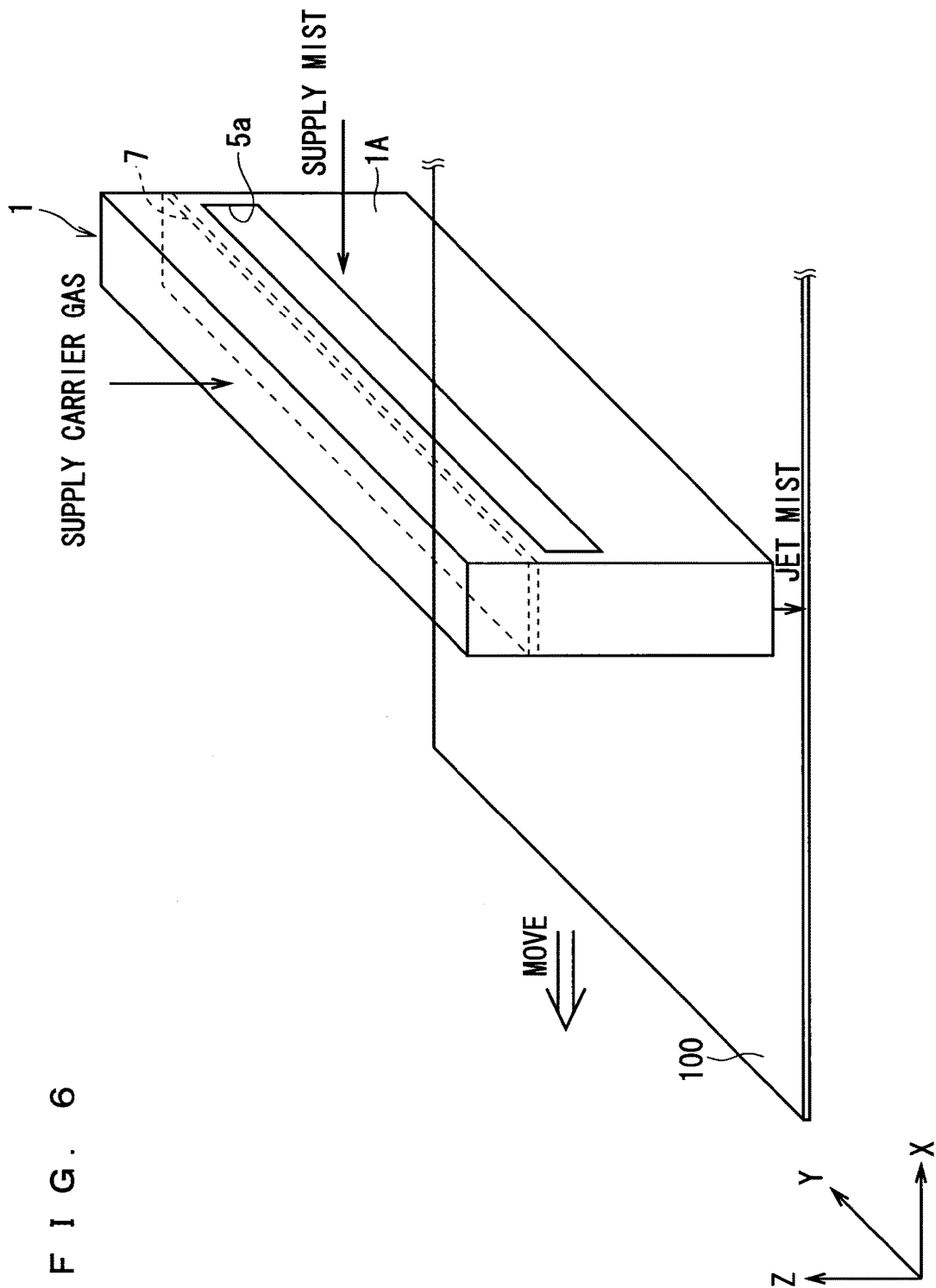
FIG. 6 A perspective view illustrating an outline configuration of an external appearance of a mist jet nozzle 1 according to the embodiment 3.

As shown in FIG. 6, the mist supply port 5a having a rectangular shape is formed to pierce the side surface of the main body 1A. The mist generator 2 is directly connected to the side surface of the main body 1A so as to close the mist supply port 5a as shown in FIG. 5. The main body 1A and the mist generator 2 are directly connected to each other by fastening means such as a bolt.

Except for the above-described configuration, the film formation device according to this embodiment is identical to the film formation device according to the embodiment 1.

In this embodiment, the raw material solution turned into a mist by the mist generator 2 is conveyed by the carrier gas and directly supplied to the inside of the mist jet nozzle 1 without interposition of a mist pipe.

Therefore, the mist pipe 5 shown in FIG. 2 can be omitted. This can further simplify the configuration of the film formation device, reduce the manufacturing costs of the film formation device, and make the assembling of the film formation device easy.

In the configuration shown in FIG. 2, the mist generated by the mist generator 2 is throttled in the mist pipe 5, and then supplied to the second space 1T. In this embodiment, mist generated by the mist generator 2 can be sent into the second space 1T without being throttled. Accordingly, as compared with the configuration according to the embodiment 1, the configuration according to this embodiment can further improve the efficiency of supply of the mist. Since the mist pipe 5 is not provided, for example, condensing of the mist in the mist pipe 5 does inevitably not occur in the film formation device according to this embodiment.

In this embodiment, the mist supply port 5a having a rectangular shape (elongated in the Y-direction) is formed to pierce the main body 1A. This allows the mist to be supplied in a wide range within the second space 1T, without arranging a plurality of mist pipes.

Embodiment 4

Figure 7:
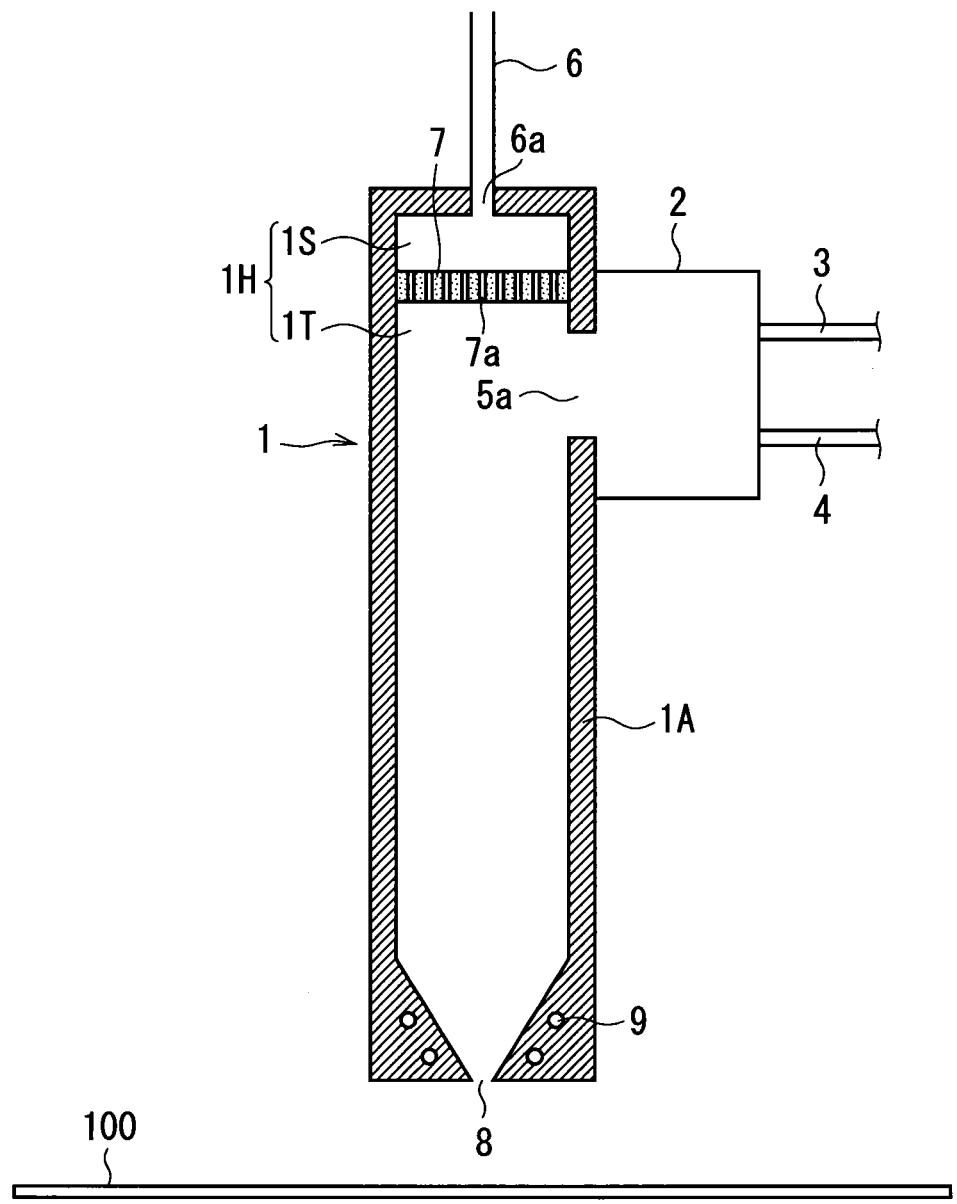
FIG. 7 A cross-sectional view illustrating a configuration of a film formation device according to an embodiment 4.

FIG. 7 shows a configuration of a film formation device according to this embodiment.

As shown in FIG. 7, in this embodiment, a temperature adjuster is provided in the main body 1A. Except that the temperature adjuster 9 is provided, the configuration of the film formation device according to this embodiment is identical to the configuration of the film formation device according to other embodiments described above.

In a configuration shown in FIG. 7, the temperature adjuster 9 is formed in a portion of the main body 1A around the spout 8. As the temperature adjuster 9, a passage is adoptable. A fluid whose temperature has been adjusted is circulated through the passage, and thereby the temperature within the hollow portion 1H can be adjusted. For the temperature adjustment, heating or cooling is performed within a temperature range that does not cause an aggregation of the mist within the hollow portion 1H and that does not cause a reaction, a decomposition, and the film formation of the mist within the hollow portion 1H. The object temperature of the adjustment of the temperature adjuster 9 varies depending on a heating temperature of the substrate 100, the kind of the raw material of the thin film which is a constituent of the mist, and the like.

The mist may aggregate when coming in contact with an inner wall of the mist jet nozzle 1 which has a low temperature. The aggregation of the mist hinders uniform jetting of the mist, causes a liquid of the aggregated mist to drop onto the substrate 100, or the like. When the mist aggregates within the mist jet nozzle 1, the efficiency of the use of the raw material of the thin film is deteriorated.

On the other hand, when the temperature of the mist jet nozzle 1 is excessively high, the mist of the raw material causes a decomposition and film formation within the mist jet nozzle 1. If not being decomposed, a solvent of the mist is vaporized so that the raw material is deposited. In this phenomenon, too, hindrance to uniform jetting of the mist, a deterioration in the efficiency of the use of the raw material of the thin film, and the like, are caused.

Therefore, in the film formation device according to this embodiment, the mist jet nozzle 1 includes the temperature adjuster 9. Accordingly, in the mist jet nozzle 1, an appropriate temperature that does not cause an aggregation of the mist and that does not cause a vaporization and a decomposition of the mist can be kept.

The configuration shown in FIG. 7 is identical to the configuration shown in FIG. 5 except that the temperature adjuster 9 is additionally provided. Here, needless to say, it is also adoptable that, in the same manner as described above, the temperature adjuster 9 is additionally provided to the configuration shown in FIG. 2 (see FIG. 8).

Figure 8:
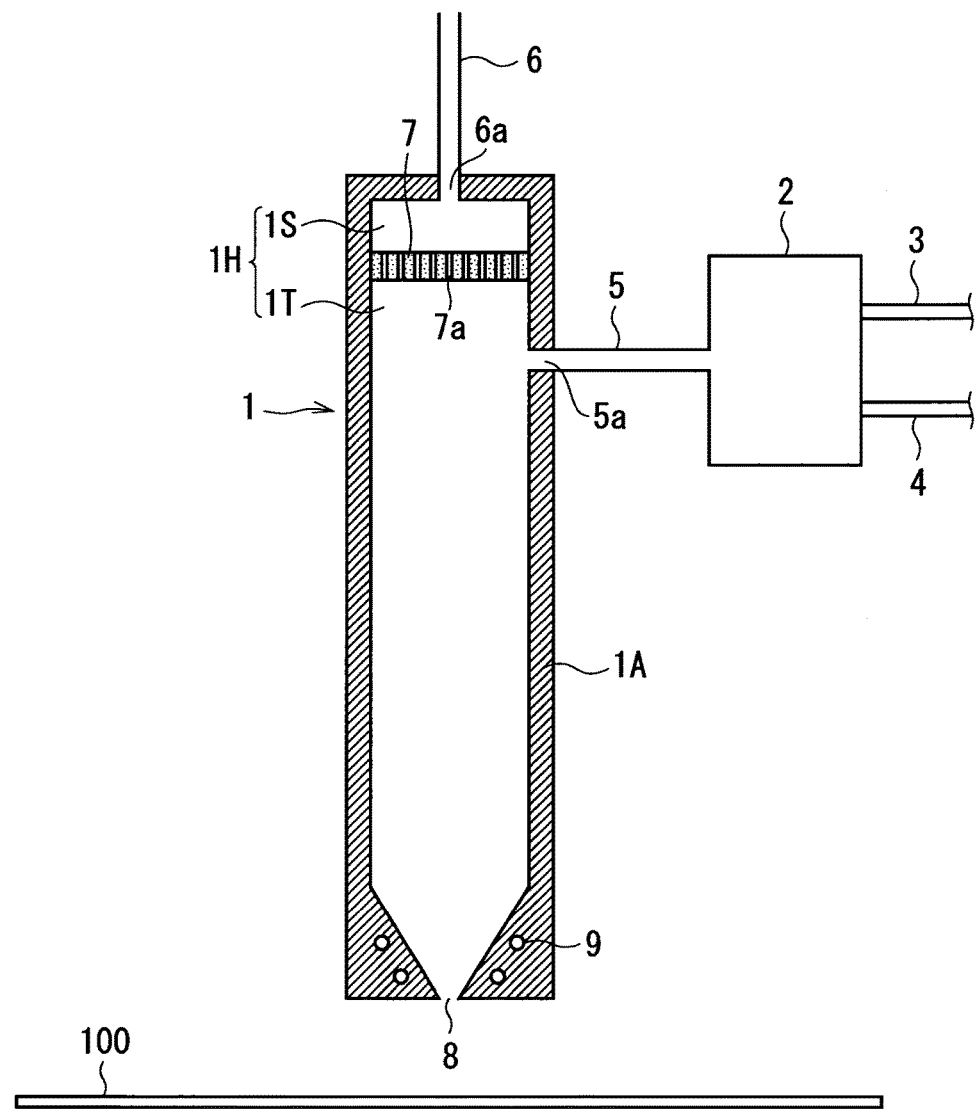
FIG. 8 A cross-sectional view illustrating an example of another configuration of the film formation device according to the embodiment 4.

In the configurations shown in FIGS. 7 and 8, the temperature adjuster 9 is formed in a portion of the main body 1A around the spout 8. The substrate 100 is heated, and an influence of this heating is most received by the portion of the main body 1A around the spout 8. Therefore, the temperature adjuster 9 is provided at least in the portion of the main body 1A around the spout 8. Thereby, the temperature within the hollow portion 1H (particularly, the temperature in the vicinity of the spout 8) can be adjusted to a proper temperature (in a temperature range that does not cause an aggregation of the mist and that does not cause a decomposition and a deposition of the mist), with prevention of complication (or a size increase) of the structure of the main body 1A.

Figure 9:
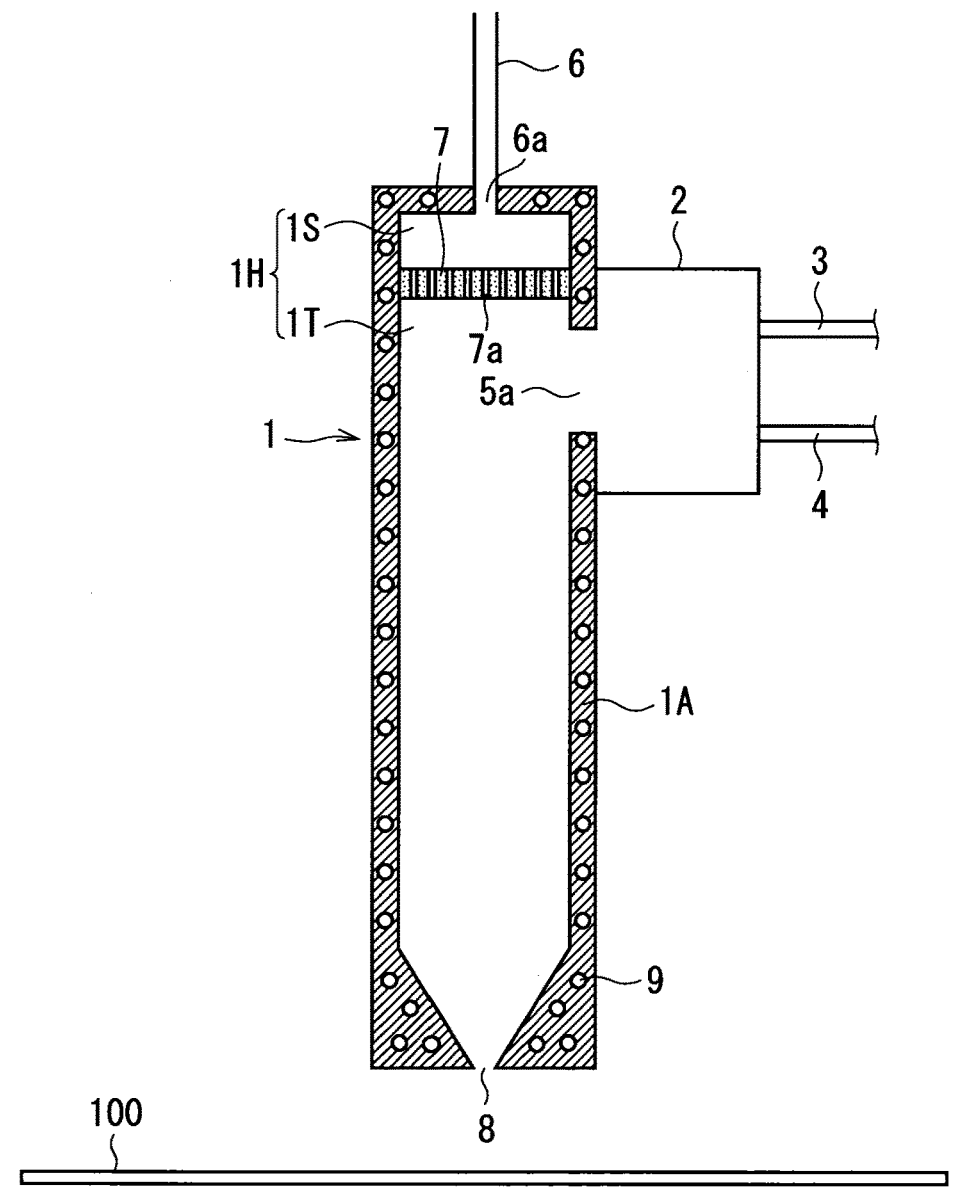
FIG. 9 A cross-sectional view illustrating an example of another configuration of the film formation device according to the embodiment 4.
Figure 10:
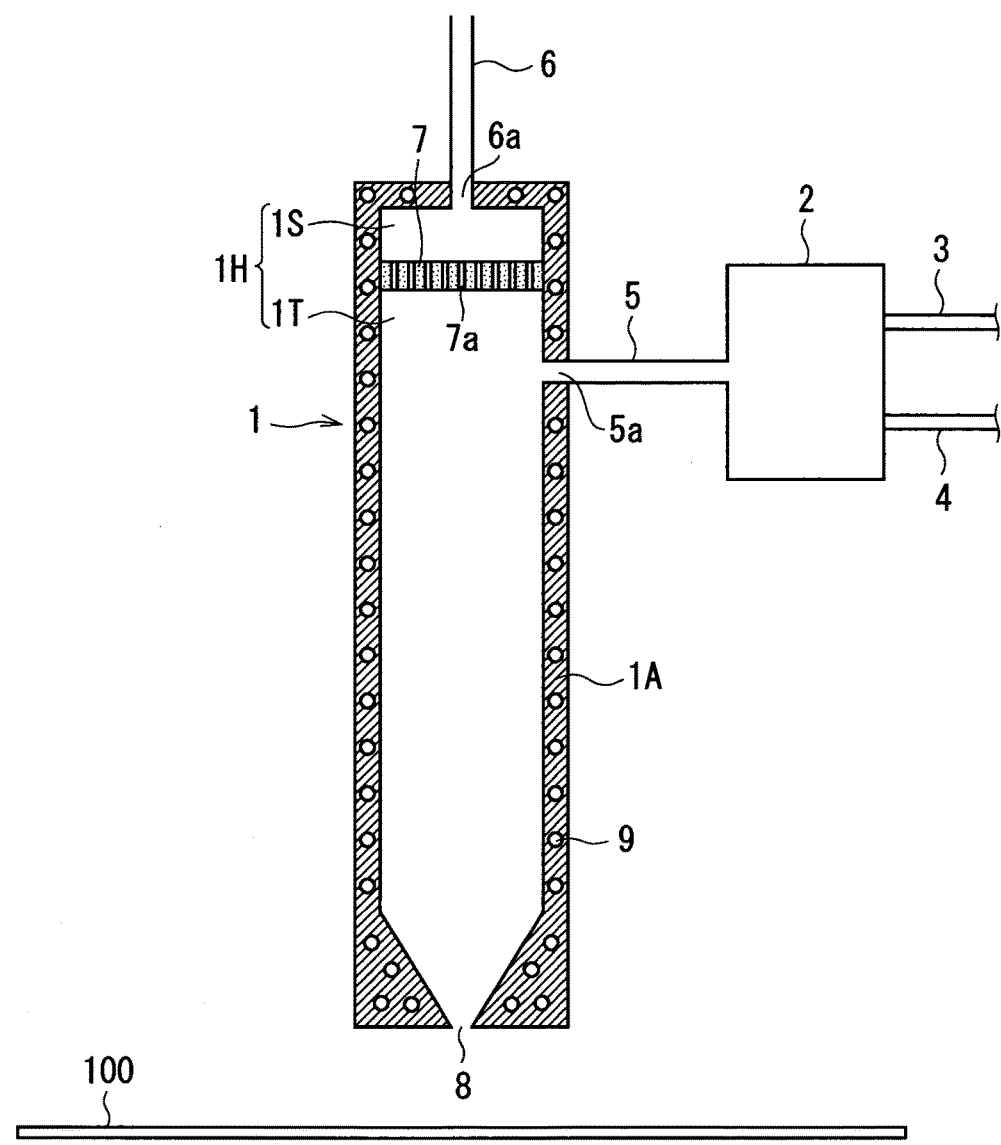
FIG. 10 A cross-sectional view illustrating an example of another configuration of the film formation device according to the embodiment 4.

It may be also acceptable that, as shown in FIGS. 9 and 10, the temperature adjuster 9 is uniformly arranged throughout an entire surface of a wall part of the main body 1A (or at least throughout a wall part of the main body 1A facing the second space 1T). Adoption of the configurations shown in FIGS. 9 and 10 enables the temperature of the entire space within the hollow portion 1H (or within the second space 1T) to be adjusted to a more proper temperature than the configurations shown in FIGS. 7 and 8. That is, the configurations shown in FIGS. 9 and 10 can completely prevent reduction of the mist due to an aggregation, a decompose, a deposition, and the like, in the hollow portion 1H.

In the above, a passage that allows a fluid whose temperature has been adjusted to flow therethrough is mentioned as an example of the temperature adjuster 9. However, other configurations (such as a heat pipe, a cool plate, or a hot plate) are adoptable as long as it can adjust the temperature within the hollow portion 1H.

Embodiment 5

Figure 11:
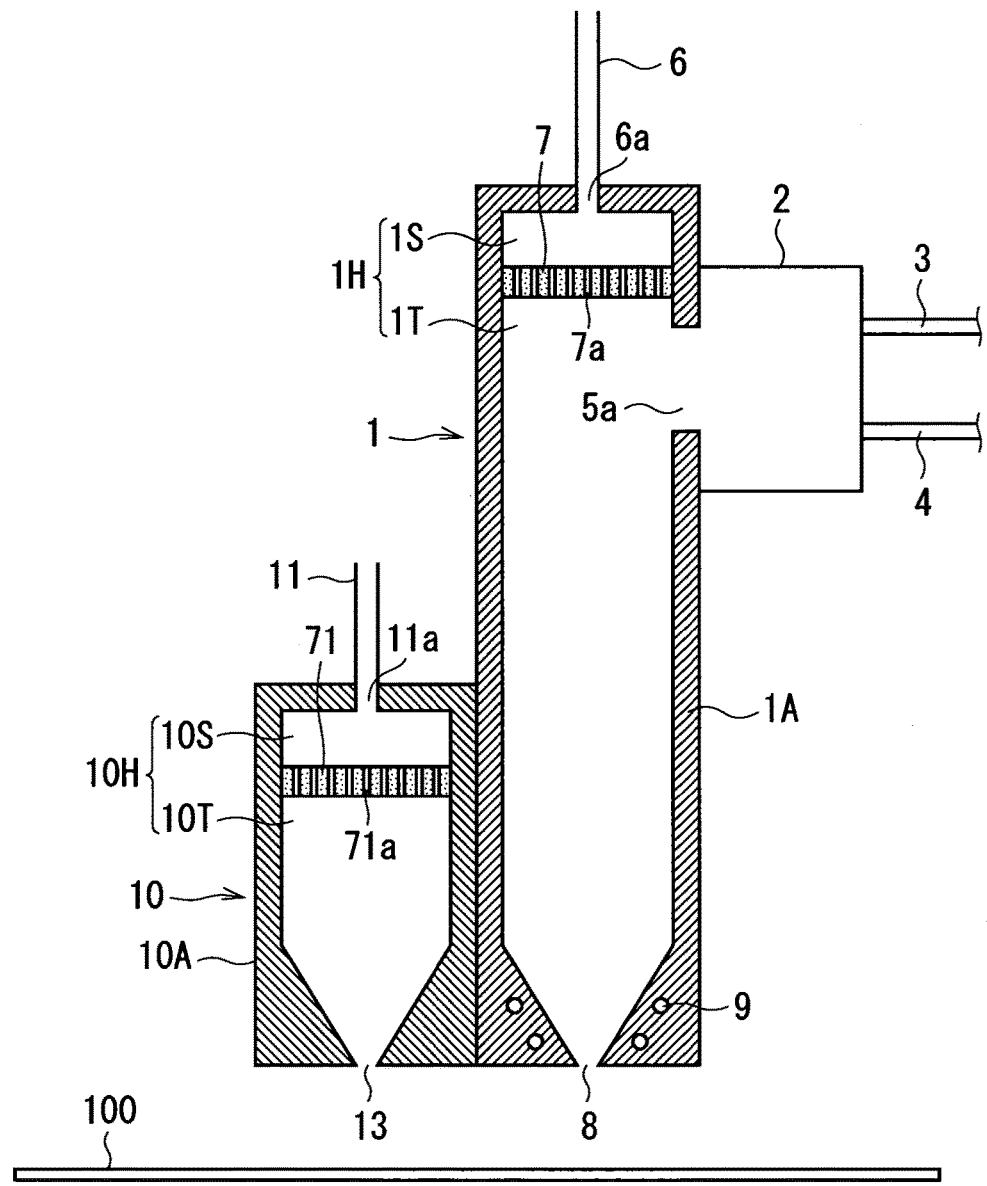
FIG. 11 A cross-sectional view illustrating a configuration of a film formation device according to an embodiment 5.

FIG. 11 shows a configuration of a film formation device according to this embodiment. FIG. 12 is a plan view of the configuration shown in FIG. 11, as seen along the Z-direction. In FIG. 12, for simplification of the drawing, illustration of the mist generator 2, the various kinds of pipes 3, 4, 6, 11, and the like, is omitted.

As shown in FIGS. 11 and 12, the film formation device according to this embodiment includes a reaction-promoting-gas jet nozzle 10 in addition to the mist jet nozzle 1. In an exemplary configuration shown in FIG. 11, the nozzle shown in FIG. 7 is illustrated as the mist jet nozzle 1. The configuration of the mist jet nozzle 1 has been already described in the embodiments above, and therefore a description thereof will be omitted here.

As shown in FIG. 11, during formation of a thin film on the substrate 100, the reaction-promoting-gas jet nozzle 10 as well as the mist jet nozzle 1 is placed above the substrate 100. The reaction-promoting-gas jet nozzle 10 jets a reaction promoting gas to the upper surface of the substrate 100, whereas the mist jet nozzle 1 jets the mist to the upper surface of the substrate 100. Here, the reaction promoting gas means a gas for promoting a decomposition and a reaction of the mist that contains the raw material for the film formation. An active gas is adoptable as the reaction promoting gas. Specific examples of the reaction promoting gas include ozone, ammonia, or hydrogen peroxide.

While the mist and the reaction promoting gas are being jetted, for example, the substrate 100 is moved in the horizontal direction (in the X-direction in FIG. 12). A spout (that can be considered as a second spout) 13 of the reaction promoting gas is adjacent to the spout 8 for the mist such that the jetted mist and the jetted reaction promoting gas can be mixed in the vicinity of the upper surface of the substrate 100, as will be described later. In order to enable the mist and the reaction promoting gas to be mixed in the vicinity of the upper surface of the substrate 100, it is preferable that the spout 8 and the spout 13 are adjacent to each other with a distance therebetween being about several mm. It is also desirable that the spout 8 and/or the spout 13 is shaped such that a direction in which the mist is jetted and a direction in which the reaction promoting gas is jetted intersect each other in the vicinity of the upper surface of the substrate 100.

During the jetting of the mist and the reaction promoting gas, it is preferable that the distance from the upper surface of the substrate 100 to the spout 8 is equal to the distance from the upper surface of the substrate 100 to the spout 13. This distance is several mm (for example, about 1 to 2 mm). A force of jetting of the mist (the flow rate of the jetted mist) and a force of jetting of the reaction promoting gas (the flow rate of the jetted reaction promoting gas) are, for example, equal to each other (here, the force of jetting of the mist (the flow rate of the jetted mist) and the force of jetting of the reaction promoting gas (the flow rate of the jetted reaction promoting gas) may be different from each other).

As shown in FIG. 11, the reaction-promoting-gas jet nozzle 10 includes a main body 10A with a hollow portion 10H. As shown in FIGS. 11 and 12, an outline external appearance of the main body 10A has a substantially rectangular parallelepiped shape whose width in the X-direction is short (for example, about several cm), whose depth in the Y-direction is long (equal to the diameter of the mist jet nozzle 1 in the Y-direction, and for example, about 1 m or more), and whose height in the Z-direction is, though not particularly limited, lower than the height of the mist jet nozzle 1 in the Z-axis direction in an exemplary configuration shown in FIG. 11.

As shown in FIG. 11, the spout 13 and a reaction-promoting-gas supply port 11a are formed to pierce the main body 10A.

The spout 13 serves as an exit for the reaction promoting gas, and jets the reaction promoting gas contained within the main body 10A toward the substrate 100. Accordingly, the spout 13 is formed in a surface of the main body 10A facing the upper surface (on which a thin film is to be formed) of the substrate 100 during the jetting of the reaction promoting gas. That is, the spout 13 is formed in a lower surface of the main body 10A. The width of the spout 13 in the X-direction is narrower than the width of the hollow portion 10H of the main body 10A in the X-direction. For example, the width of the spout 13 in the X-direction is about 1 to 2 mm. An opening of the spout 13 has a slit-like shape, and the diameter of the spout 13 in the Y-direction is equal to the diameter of the spout 8 in the Y-direction. A thin portion of the main body 10A is located at both ends of the spout 13 with respect to the Y-direction.

In the exemplary configuration shown in FIG. 11, the reaction-promoting-gas supply port 11a is provided in a surface of the main body 10A opposed to the spout 13 (that is, in an upper surface of the main body 10A) (the reaction-promoting-gas supply port 11a may be arranged in a side surface of the main body 10A). The reaction-promoting-gas supply port 11a serves as an entrance for the reaction promoting gas that is supplied from the outside of the reaction-promoting-gas jet nozzle 10 into the hollow portion 10H of the main body 10A. As shown in FIG. 11, the reaction promoting gas passes through a reaction-promoting-gas pipe 11 and reaches the reaction-promoting-gas supply port 11a, and is supplied from the reaction-promoting-gas supply port 11a to the inside of the main body 10A.

The number of reaction-promoting-gas supply ports 11a may be one, or alternatively two or more reaction-promoting-gas supply ports 11a may be provided along the Y-direction in the upper surface of the main body 10A. However, from the viewpoint of simplification of the configuration of the reaction-promoting-gas jet nozzle 10, a smaller number of reaction-promoting-gas supply ports 11a is preferable. Needless to say, in accordance with the number of reaction-promoting-gas supply ports 11a, corresponding reaction-promoting-gas pipes 11 each connected to each of the reaction-promoting-gas supply ports 11a are arranged.

When the opening area of the reaction-promoting-gas supply port 11a and the opening area of the reaction-promoting-gas pipe 11 are excessively large, the size of the configuration may increase. Accordingly, it is desirable that the total opening area of the reaction-promoting-gas supply port 11a is larger than the total opening area of holes 71a that are formed to pierce a shower plate 71, and as long as such a relationship is satisfied, the opening area of the reaction-promoting-gas supply port 11a is preferably as small as possible.

The shower plate 71 is arranged in the reaction-promoting-gas jet nozzle 10. As shown in FIG. 11, the shower plate 71 is arranged within the hollow portion 10H of the main body 10A. As seen from FIG. 11, the shower plate 71 divides the hollow portion 10H into two spaces 10S and 10T. That is, the shower plate 71 partitions the inside of the hollow portion 10H into a first space 10S and a second space 10T. The plane shape of the shower plate 71 (including a manner in which the holes 71a are formed therein) is identical to the plane shape of the shower plate 7 shown in FIG. 3.

The shower plate 71 is a thin plate and may be made of, for example, stainless steel. As shown in FIG. 11, a plurality of holes 71a are evenly formed to pierce the shower plate 71. Each of the holes 71a is formed through the shower plate 71 in a thickness direction thereof. Through the holes 71a, the reaction promoting gas in a "gaseous state" passes. Accordingly, the opening of each hole 71a is able to have a fine diameter. No particular limitation is put on the diameter of the opening of each hole 71a, but in one example, it is about 0.01 mm.

As shown in FIG. 11, the reaction-promoting-gas supply port 11a is connected to the first space 10S, while the spout 13 is connected to the second space 10T. The reaction promoting gas supplied from the reaction-promoting-gas supply port 11a spreads and permeates the first space 10S because of the presence of the shower plate 71, and passes through the holes 71a to be uniformly led to the second space 10T. The reaction promoting gas having passed through the holes 71a keeps its regulated uniform stream, and in this condition, is conveyed in the second space 10T and led to the spout 13, to be then uniformly jetted from the spout 13.

Use of the reaction promoting gas that is a gas having a high reactivity can promote a decomposition and a reaction of the raw material (mist), which is beneficial because a thin film with a high quality can be formed on the substrate 100 at a low temperature. It is indeed possible to adopt a configuration in which, for example, the mist and the reaction promoting gas are mixed within the mist jet nozzle 1. However, because of the high reactivity of the reaction promoting gas, the mist is decomposed within the mist jet nozzle 1. Such a decomposition of the mist causes a deteriorate in the uniformity of the jetted mist and a deterioration in the efficiency of the use of the raw material (mist) (in other words, a large amount of the raw material is required in order to form a thin film on the substrate 100).

Accordingly, the film formation device according to this embodiment further includes the reaction-promoting-gas jet nozzle 10. The reaction-promoting-gas jet nozzle 10 includes the spout 13 that jets the reaction promoting gas. The spout 13 is arranged adjacent to the spout 8 that jets the mist.

Therefore, in the film formation device according to this embodiment, the mist and the reaction promoting gas can be mixed in the vicinity of the upper surface of the substrate 100, which is outside the mist jet nozzle 1. As a result, a decomposition and a reaction of the mist are promoted without occurrence of problems such as a deterioration in the uniformity of the mist and a deterioration in the efficiency of use of the raw material.

In the configuration shown in FIG. 11, the reaction-promoting-gas jet nozzle 10 is adjacent to the mist jet nozzle 1 shown in FIG. 7. Here, the reaction-promoting-gas jet nozzle 10 according to this embodiment may be adjacent to the mist jet nozzle 1 (each of the mist jet nozzles 1 shown in FIGS. 2, 5, 8, 9, 10, and the like) of other embodiments (configurations) described above.

Embodiment 6

Figure 13:
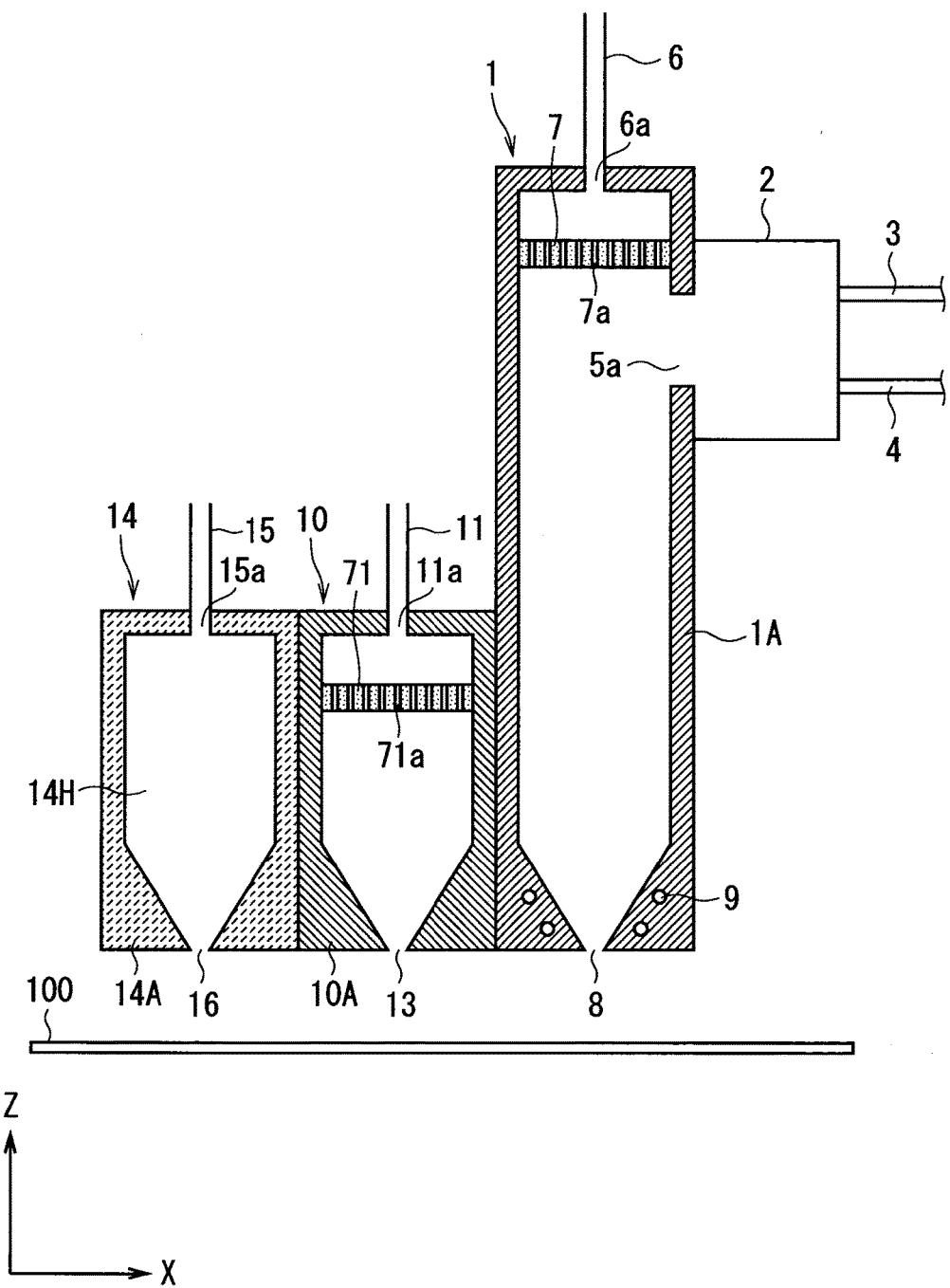
FIG. 13 A cross-sectional view illustrating a configuration of a film formation device according to an embodiment 6.
Figure 14:
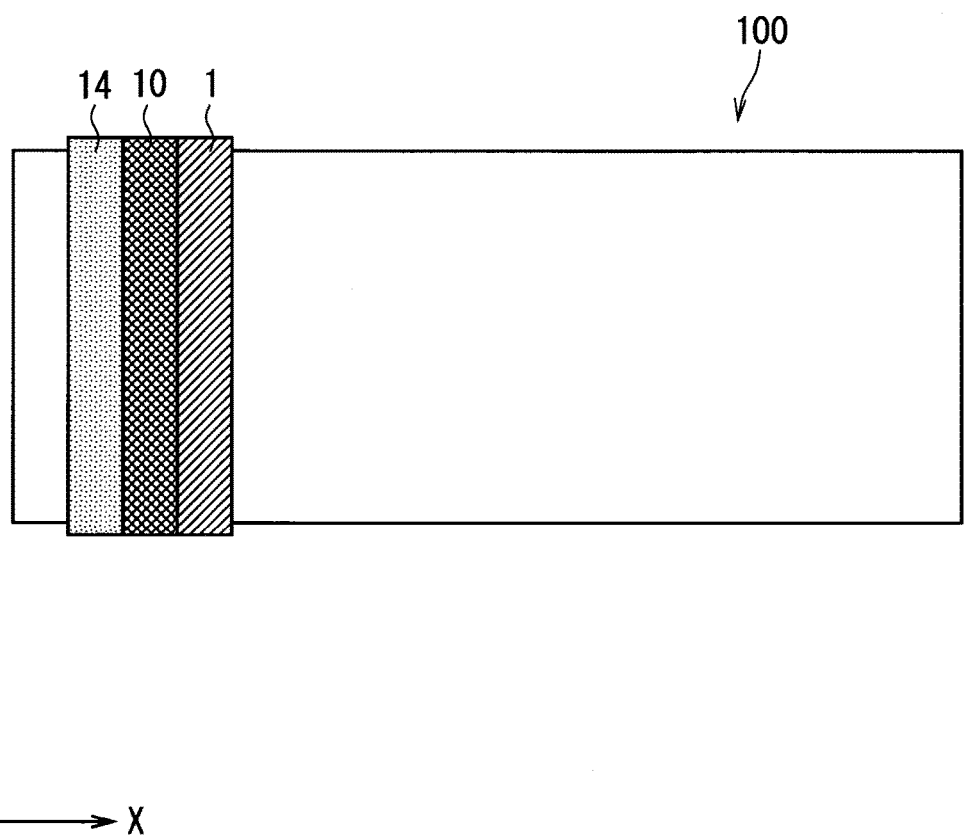
FIG. 14 A plan view illustrating an outline configuration of the film formation device according to the embodiment 6.

FIG. 13 shows a configuration of a film formation device according to this embodiment. FIG. 14 is a plan view of the configuration shown in FIG. 13, as seen along the Z-direction. In FIG. 14, for simplification of the drawing, illustration of the mist generator 2, the various kinds of pipes 3, 4, 6, 11, 15, and the like, is omitted.

As shown in FIGS. 13 and 14, the film formation device according to this embodiment includes not only the mist jet nozzle 1 and the reaction-promoting-gas jet nozzle 10 but also an exhaust nozzle 14. In an exemplary configuration shown in FIG. 13, the nozzle shown in FIG. 7 is illustrated as the mist jet nozzle 1, and the nozzle shown in FIG. 11 is illustrated as the reaction-promoting-gas jet nozzle 10. The configurations of the mist jet nozzle 1 and the reaction-promoting-gas jet nozzle 10 have been already described in the embodiments above, and therefore a description thereof will be omitted here.

As shown in FIG. 13, during formation of a thin film on the substrate 100, the exhaust nozzle 14 as well as the mist jet nozzle 1 and the reaction-promoting-gas jet nozzle 10 is placed above the substrate 100. The exhaust nozzle 14 sucks (exhausts) a region above the substrate 100, whereas the mist jet nozzle 1 jets the mist to the upper surface of the substrate 100 and the reaction-promoting-gas jet nozzle 10 jets the reaction promoting gas to the upper surface of the substrate 100.

While the mist and the reaction promoting gas are being jetted and additionally an exhaust process is being performed, for example, the substrate 100 is moved in the horizontal direction (in the X-direction in FIG. 14). An exhaust port 16, the spout 13 for the reaction promoting gas, and the spout 8 for the mist are arranged adjacent in one direction (in FIGS. 13 and 14, in the X-direction) starting from the exhaust port 16 of the exhaust nozzle 14.

During the exhaust process and the jetting of the mist and the reaction promoting gas, it is preferable that the distance from the upper surface of the substrate 100 to the spout 8, the distance from the upper surface of the substrate 100 to the spout 13, and the distance from the upper surface of the substrate 100 to the exhaust port 16 are equal. This distance is several mm (for example, about 1 to 2 mm). A force of jetting of the mist (the flow rate of the jetted mist), a force of jetting of the reaction promoting gas (the flow rate of the jetted reaction promoting gas), and a force of exhaust (the flow rate of exhaust) are, for example, equal to one another.

As shown in FIG. 13, the exhaust nozzle 14 includes a main body 14A with a hollow portion 14H. As shown in FIGS. 13 and 14, in the main body 14A, the width in the X-direction is short (for example, about several cm), the depth in the Y-direction is long (equal to the diameter of the mist jet nozzle 1 in the Y-direction and the diameter of the reaction-promoting-gas jet nozzle 10 in the Y-direction, and for example, about 1 m or more), and the height in the Z-direction is, though not particularly limited, lower than the height of the mist jet nozzle 1 in the Z-axis direction and equal to the height of the reaction-promoting-gas jet nozzle 10 in the Z-axis direction in an exemplary configuration shown in FIG. 13. An outline external appearance of the main body 14A also has a substantially rectangular parallelepiped shape.

As shown in FIG. 13, the exhaust port 16 and an exhaust pipe connection portion 15a are formed to pierce the main body 14A.

The exhaust port 16 at least sucks a gas, a liquid, and a solid existing in a space formed between the upper surface of the substrate 100 and each of the nozzles 1, 10, 14, into the main body 14A. Accordingly, the exhaust port 16 is formed in a surface of the main body 14A facing the upper surface (on which a thin film is to be formed) of the substrate 100 during the exhaust process. That is, the exhaust port 16 is formed in a lower surface of the main body 14A.

The width of the exhaust port 16 in the X-direction is narrower than the width of the hollow portion 14H of the main body 14A in the X-direction. For example, the width of the exhaust port 16 in the X-direction is about 1 to 2 mm. An opening of the exhaust port 16 has a slit-like shape, and the diameter of the exhaust port 16 in the Y-direction is equal to the diameters of the spout 8 and the spout 13 in the Y-direction. A thin portion of the main body 14A is located at both ends of the exhaust port 16 with respect to the Y-direction.

The exhaust pipe connection portion 15a is provided in a surface of the main body 14A opposed to the exhaust port 16 (that is, in an upper surface of the main body 14A). The solid, the liquid, and the gas sucked by the exhaust port 16 are, through the exhaust pipe connection portion 15a and an exhaust pipe 15, exhausted to the outside of the exhaust nozzle 14 which is remote from the substrate 100.

The number of exhaust pipe connection portions 15a may be one, or alternatively two or more exhaust pipe connection portions 15a may be provided along the Y-direction in the upper surface of the main body 14A. However, from the viewpoint of simplification of the configuration of the exhaust nozzle 14, a smaller number of exhaust pipe connection portions 15a is preferable. Needless to say, in accordance with the number of exhaust pipe connection portions 15a, corresponding exhaust pipes 15 each connected to each of the exhaust pipe connection portions 15a are arranged.

When the opening area of the exhaust pipe connection portion 15a and the opening area of the exhaust pipe 14 are excessively large, the size of the configuration may increase. Accordingly, it is preferable that they are made as small as possible.

The film formation device according to this embodiment further includes the exhaust nozzle 14. This can produce a uniform stream in which the mist jetted from the mist jet nozzle 1 and the reaction promoting gas jetted from the reaction-promoting-gas jet nozzle 10 flow toward the exhaust nozzle 14 (in other words, a uniform stream that flows in the horizontal direction (X-direction) parallel to the upper surface of the substrate 100). As a result, mixing of the mist and the reaction promoting gas can be promoted in a path of this stream which is above the substrate 100.

For the promotion of mixing of the mist and the reaction promoting gas, it is necessary that the exhaust port 16, the spout 13, and the spout 8 arranged adjacent along one direction (in FIG. 13, the right direction) starting from the exhaust port 16, as shown in FIG. 13.

That is, from the viewpoint of the promotion of mixing, it is not desirable that only the spout 8 is arranged at one side (for example, to the right or left in FIG. 13) of the exhaust port 16 while only the spout 13 is arranged at the other side (to the left or right in FIG. 13) of the exhaust port 16. In such a configuration, in a path extending from one spout 8 (or 13) to the exhaust port 16, the other spout 13 (or 8) does not exist. This suppresses mixing of the mist and the reaction promoting gas.

Although in FIG. 13 the exhaust port 16, the spout 13, and the spout 8 are arranged adjacent in this order, they may be arranged adjacent in the order of the exhaust port 16, the spout 8, and the spout 13.

As described above, the configuration in which only the spout 8 is arranged at one side (for example, to the right or left in FIG. 13) of the exhaust port 16 while only the spout 13 is arranged at the other side (to the left or right in FIG. 13) of the exhaust port 16 is not desirable from the viewpoint of the promotion of mixing. In this respect, the following configuration is adoptable because it promotes mixing of the mist and the reaction promoting gas. To be specific, a configuration is adoptable in which a set of the spout 8 and spout 13 is arranged adjacent at one side (for example, to the right in FIG. 13) of the exhaust port 16 while a set of the spout 8 and spout 13 is similarly arranged at the other side (to the left in FIG. 13) of the exhaust port 16. This is because this configuration also achieves a state in which the exhaust port 16, the spout 8, and the spout 13 are arranged adjacent in one direction starting from the exhaust port 16.

Unlike the configuration shown in FIG. 13, the reaction-promoting-gas jet nozzle 10 may not be provided in the configuration shown in FIG. 13. In such a case, only the spout 8 and the exhaust port 16 are arranged adjacent.

The mist is, immediately after being spouted from the mist jet nozzle 1, uniformized in the Z-axis direction in FIG. 13, but then the uniformity may deteriorate because of, for example, collision with the substrate 100. Such a deterioration in the uniformity may cause unevenness of the thin film formed on the upper surface of the substrate 100. Accordingly, in FIG. 13, the spout 8 and the exhaust port 16 are arranged adjacent, to enable the mist to be evenly (uniformly) sucked in the horizontal direction (X-Y direction) that is parallel to the upper surface of the substrate 100. That is, the sucking by the exhaust port 16 can produce a stream in which the mist jetted from the mist jet nozzle 1 uniformly flows in the X-Y horizontal direction toward the exhaust port 16. Thus, the evenness of the thin film formed on the upper surface of the substrate 100 can be improved.

The configuration shown in FIG. 13 includes the mist jet nozzle 1 shown in FIG. 7. Instead, the mist jet nozzle 1 (each of the mist jet nozzles 1 shown in FIGS. 2, 5, 8, 9, 10, and the like) of other embodiments (configurations) described above is adoptable as the mist jet nozzle 1 according to this embodiment.

When the force of exhaust by the exhaust nozzle 14 is excessively strong, a reaction and a decomposition of the mist occurring on the upper surface of the substrate 100 are reduced. When the force of exhaust by the exhaust nozzle 14 is excessively weak, the uniformity of the mist stream flowing toward the exhaust nozzle 14 is not improved. Accordingly, from the viewpoint of improvement in the efficiency of a reaction and a decomposition of the mist and improvement in the uniformity of the mist stream, it is desirable that the force of exhaust by the exhaust nozzle 14 is equal to the force of jetting from the mist jet nozzle 1.

Embodiment 7

Figure 15:
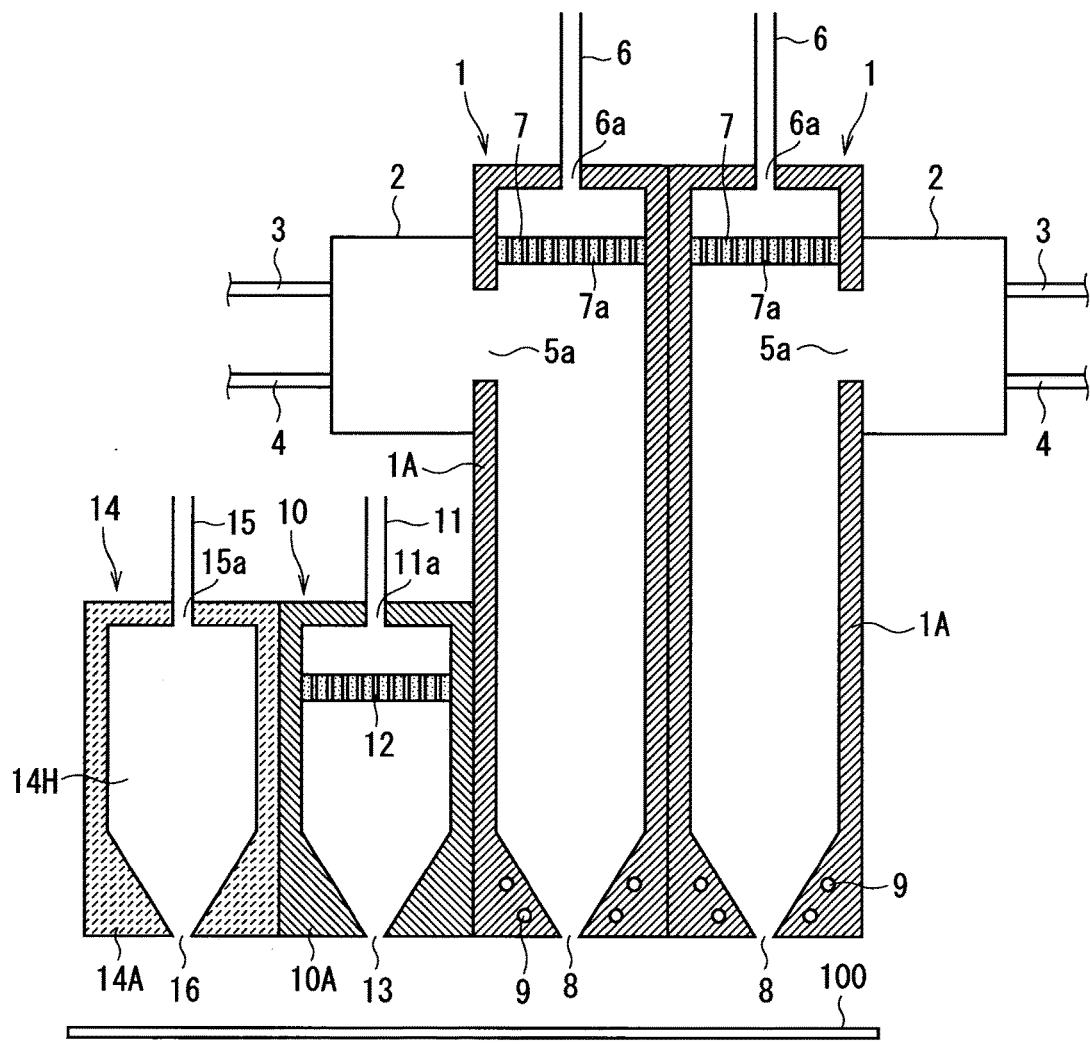
FIG. 15 A cross-sectional view illustrating a configuration of a film formation device according to an embodiment 7.

FIG. 15 shows a configuration of a film formation device according to this embodiment.

As shown in FIG. 15, the film formation device according to this embodiment has the same configuration as shown in FIG. 13 except that a second mist jet nozzle 1 is additionally provided. Thus, in this embodiment, there are a plurality of mist jet nozzles 1.

The configuration shown in FIG. 15 is identical to the configuration shown in FIG. 13, except that the number of mist jet nozzles 1 is increased. In an exemplary configuration shown in FIG. 15, the nozzle shown in FIG. 7 is illustrated as the mist jet nozzle 1. Thus, the configurations of the nozzles 1, 10, and 14 have been already described in the embodiments above, and therefore a description thereof will be omitted here.

In the configuration shown in FIG. 15, the spouts 8, 13 and the exhaust port 16 are arranged adjacent. Here, in this embodiment as well as described in the embodiment 6, the exhaust port 16, the spout 13 for the reaction promoting gas, and the two spouts 8 for the mist are arranged adjacent in one direction (in FIG. 15, in the X-direction) starting from the exhaust port 16 of the exhaust nozzle 14.

The film formation device according to this embodiment includes a plurality of mist jet nozzles 1. This enables two or more kinds of mists to be separately jetted to the substrate 100.

For example, it is possible that one of the mist jet nozzles 1 jets a raw material mist that contains the raw material of the thin film to be formed while the other mist jet nozzle 1 jets a mist of a liquid (such as a hydrogen peroxide solution) that exerts an effect of promoting a reaction of the raw material mist. This can promote a reaction and a decomposition of the mist containing the raw material of the thin film on the upper surface of the substrate 100, as compared with the configuration shown in FIG. 13.

Alternatively, in a case where the raw material of the thin film to be formed includes two or more kinds of elements, it is possible that mists each containing each of the elements are separately jetted to the substrate 100. For example, the mist is generated by turning a raw material solution into a mist, and needless to say, a solvent is necessary for the raw material solution. Here, a situation where a solvent suitable for one of the elements is not suitable for the other element may occur. In such a case, it is desirable to apply the film formation device according to this embodiment, so that mists containing different elements are separately jetted from the respective mist jet nozzles 1, and these mists are mixed on the upper surface of the substrate 100.

Alternatively, it is also possible that, for example, in a case where a mist containing two or more kinds of solids is jetted to the upper surface of the substrate 100, only one mist jet nozzle 1 is used to jet the mist. However, adoption of such a configuration may cause the two kinds of solids to be mixed and reacted with each other within the mist jet nozzle 1. The reaction between different solids within the mist jet nozzle 1 causes unevenness of the thin film, a deterioration in the efficiency of use of the raw material, and the like. An application of the film formation device according to this embodiment enables a mist containing only a single kind of solid to exist within each of the mist jet nozzles 1. Thus, the above-described problem is removed.

In FIG. 15, the spout 13, the one spout 8, and the other spout 8 are arranged adjacent in this order at the right side of the exhaust port 16. Instead, it may be also acceptable that the spout 13 is arranged between one spout 8 and the other spout 8.

A configuration is also adoptable in which a set of the plurality of spouts 8 and the spout 13, which are shown in FIG. 15, is arranged adjacent at one side (for example, to the right in FIG. 15) of the exhaust port 16 while a set of them is arranged at the other side (to the left in FIG. 15) of the exhaust port 16. This is because this configuration also achieves a state in which the exhaust port 16, the spouts 8, and the spout 13 are arranged adjacent in one direction starting from the exhaust port 16.

In the configuration shown in FIG. 15, the reaction-promoting-gas jet nozzle 10 and/or the exhaust nozzle 14 may not be provided.

In the configuration shown in FIG. 15, each of the mist jet nozzles 1 has the configuration shown in FIG. 7. Instead, as each of the mist jet nozzles 1, the mist jet nozzle 1 (each of the mist jet nozzles 1 shown in FIGS. 2, 5, 8, 9, 10, and the like) of other embodiments (configurations) described above is adoptable. It may be also acceptable that the mist jet nozzles 1 have different configurations.

In the exemplary configuration shown in FIG. 15, two mist jet nozzles 1 are illustrated. However, two or more mist jet nozzles 1 may be provided. This increases a variation in the mist jetted to the substrate 100.

While the invention has been shown and described in detail, the foregoing description is in all aspects illustrative and not restrictive. It is therefore understood that numerous modifications and variations can be devised without departing from the scope of the invention.

DESCRIPTION OF THE REFERENCE NUMERALS 1 mist jet nozzle
1A, 10A, 14A main body
1H, 10H, 14H hollow portion
1S, 10S first space
1T, 10T second space
2 mist generator 3, 6 carrier gas pipe
4 raw material solution pipe
5 mist pipe
5a mist supply port
6a carrier gas supply port
7, 71 shower plate
7a, 71a hole
8, 13 spout
9 temperature adjuster
10 reaction-promoting-gas jet nozzle
11 reaction-promoting-gas pipe
11a reaction-promoting-gas supply port
14 exhaust nozzle
15 exhaust pipe
15a exhaust pipe connection portion
16 exhaust port
100 substrate

The invention claimed is:

1. A film formation device comprising:
a mist generator that generates a mist of a raw material of a film to be formed; and
a mist jet nozzle that jets the mist to a substrate on which a film is to be formed,
the mist jet nozzle comprising:
   a main body having a hollow portion;
   a mist supply port formed in the main body and configured to supply the mist to the inside of the hollow portion;
   a first spout formed in the main body and configured to jet the mist in the hollow portion to the outside;
   a carrier gas supply port formed in the main body and configured to supply a carrier gas to the inside of the hollow portion, the carrier gas transporting the mist to the first spout; and
   a shower plate arranged within the hollow portion and having a plurality of holes formed therein,
wherein
the hollow portion comprises a first space and a second space divided by the shower plate,
the first space is connected to the carrier gas supply port,
the second space is connected to the first spout,
the mist supply port is formed in the main body so as to be connected to the second space, and
a total of opening areas of the plurality of holes formed in the shower plate is smaller than a total of an opening area of the carrier gas supply port.

2. The film formation device according to claim 1, wherein
the mist supply port is connected to a mist pipe configured to transport the mist generated by the mist generator to the inside of the hollow portion.

3. The film formation device according to claim 1, wherein
the mist generator is directly connected to the main body so as to close the mist supply port.

4. The film formation device according to claim 1, wherein
the mist jet nozzle further comprises a temperature adjuster at least in a portion of the main body around the first spout, wherein the temperature adjuster is configured to adjust a temperature of the hollow portion.

5. The film formation device according to claim 4, wherein
the temperature adjuster is arranged throughout the main body of the mist gas jet nozzle.

6. The film formation device according to claim 1, further comprising a reaction-promoting-gas jet nozzle comprising a second spout that jets a reaction promoting gas for promoting a decomposition and a reaction of the mist, wherein
the first spout and the second spout are adjacent to each other.

7. The film formation device according to claim 1, further comprising an exhaust nozzle comprising an exhaust port.

8. The film formation device according to claim 7, further comprising a reaction-promoting-gas jet nozzle comprising a second spout that jets a reaction promoting gas for promoting a decomposition and a reaction of the mist, wherein
the exhaust port, the first spout, and the second spout are arranged adjacent in one direction starting from the exhaust port.

9. The film formation device according to claim 7, wherein
a force of exhaust by the exhaust nozzle is equal to a force of jetting by the mist jet nozzle.

10. The film formation device according to claim 1, comprising
two or more mist jet nozzles.

* * * * *